United States Patent [19]

Yoshida et al.

[11] 4,107,725
[45] Aug. 15, 1978

[54] COMPOUND FIELD EFFECT TRANSISTOR

[75] Inventors: Takashi Yoshida; Takeshi Matsuyama, both of Hamamatsu, Japan

[73] Assignee: Nippon Gakki Seizo Kabushiki Kaisha, Hamamatsu, Japan

[21] Appl. No.: 600,476

[22] Filed: Jul. 30, 1975

[30] Foreign Application Priority Data

Aug. 2, 1974 [JP] Japan .................................. 49/88688
Aug. 21, 1974 [JP] Japan .................................. 49/95896

[51] Int. Cl.² .......................................... H01L 27/02
[52] U.S. Cl. .................................... 357/41; 307/251; 307/304; 330/307; 330/277; 330/94; 357/22; 357/55
[58] Field of Search ................... 307/251, 304; 330/35, 330/38 M, 94; 357/22, 41, 55

[56] References Cited

U.S. PATENT DOCUMENTS

| 3,725,136 | 4/1973 | Morgan | 357/22 |
| 3,742,261 | 6/1973 | Schneider et al. | 307/304 |
| 3,767,946 | 10/1973 | Berger et al. | 307/304 |
| 3,828,230 | 8/1974 | Nisizawa et al. | 357/22 |
| 3,886,001 | 5/1975 | Dobkin | 357/22 |
| 3,908,187 | 9/1975 | Sheldon et al. | 357/54 |
| 3,921,089 | 11/1975 | Tsurushima | 357/22 |

FOREIGN PATENT DOCUMENTS 45-29261  9/1970  Japan ........................................ 307/304

OTHER PUBLICATIONS

G. Csanky, "Combining FETs for Higher Gains," Electronic Design, vol. 11, Sep. 27, 1963, pp. 36-44.
G. Evan-Hart, "The Replacement of Thermionic Values by Junction Field Effect Hybrid Circuits," Electronic Components, vol. 14 #2, Jan. 26, 1973, pp. 78-81.

Primary Examiner—Joseph E. Clawson, Jr.
Attorney, Agent, or Firm—Cushman, Darby & Cushman

[57] ABSTRACT

A horizontal junction-type field effect transistor having a saturated drain current to drain voltage characteristic and constituting an input transistor and a vertical junction-type field effect transistor having an unsaturated drain current to drain voltage characteristic and constituting an output transistor are connected in cascode fashion to compose a compound field effect transistor.

This compound field effect transistor has a saturated characteristic, a high transconductance $g_m$ and a high breakdown voltage resembling those of a pentode vacuum tube.

This compound field effect transistor is constructed in the form of monolithic integrated circuitry by the combined use of the dielectric isolation technique utilizing mesa groove and the pn-junction isolation technique.

16 Claims, 14 Drawing Figures

COMPOUND FIELD EFFECT TRANSISTOR

BACKGROUND OF THE INVENTION (a) Field of the Invention

The present invention pertains to compound field effect transistor comprised of a combination of two junction-type field effect transistors and presenting a saturated characteristic (drain current-drain voltage characteristic) resembling the output characteristic of a pentode vacuum tube.

(b) Brief Description of the Prior Art

In the past, there has been proposed a compound field effect transistor which is comprised of horizontal junction-type field effect transistors having a saturated characteristic (drain current-drain voltage characteristic) resembling the output characteristic of a pentode vacuum tube, one of which transistors serving as an input transistor and the other as an output transistor which are connected together in cascode fashion (refer to Nikkei Electronics Journal, September, 1972 issue).

Said horizontal junction-type field effect transistor is of the type that the flow of the majority carriers passing through the channel region defined in the horizontal direction along the surface of the semiconductor substrate is controlled by the pn-junction gate provided so as to oppose said channel region, and this field effect transistor exhibits a saturated characteristic resembling the output characteristic of a pentode vacuum tube.

This compound field effect transistor will exhibit a high transconductance $gm$, a high breakdown voltage and a superior high frequency characteristic (due to decrease of the Miller effect capacitance of the input transistor), if the transconductance $gm$ of said input transistor is sufficiently high and if the breakdown voltage of the output transistor is sufficiently high.

In such a known compound field effect transistor, a horizontal junction-type field effect transistor is used for the output transistor of the compound field effect transistor as stated above. Accordingly, it is extremely difficult to elevate the breakdown voltage to a level over 250 volts. Also, the horizontal junction-type field effect transistor has the drawbacks that, when it is intended to elevate its breakdown voltage, the build-up characteristic of the drain current up to the point of saturation will lose sharpness, and there will tend to appear an intensified variance of the drain current $I_{DS}$ at the absence of a gate-source bias voltage and also of the pinch-off voltage. For this reason, the known compound field effect transistor has been required to sacrifice its other characteristics in order to elevate its breakdown voltage.

Also such a known compound field effect transistor as discussed above desirably is such that the whole device is formed as a monolithic integrated circuitry from the viewpoints of a higher yield in manufacture, an improvement in reliability, a reduction in size, weight and cost. However, a horizontal junction-type field effect transistor having a high breakdown voltage and a horizontal junction-type field effect transistor having a high transconductance $gm$ are markedly different from each other in the manufacturing conditions, and accordingly there two cannot be formed into a monolithic integrated circuitry. For this reason, known compound field effect transistor of this type has been arranged in the form of the so-called hybrid integrated circuitry.

SUMMARY OF THE INVENTION

It is, therefore, a main object of the present invention to provide a compound field effect transistor having a saturated characteristic resembling the output characteristic of a pentode vacuum tube and having a high breakdown voltage and a high transconductance $gm$ equal to or higher than those exhibited by a pentode vacuum tube and a large current capacity and having a superior high frequency characteristic.

Another object of the present invention is to provide a compound field effect transistor of the type described above, which is of little variance in its various characteristics.

Still another object of the present invention is to provide a compound field effect transistor of the type described above, which exhibits a very low noise.

In order to attain the above-stated objects, the compound field effect transistor according to the present invention employs as an input transistor a horizontal junction-type field effect transistor easy for obtaining a high transconductance $gm$, and employs as an output transistor a vertical field effect transistor which can easily materialize a high breakdown voltage, a large current capacity, a low internal resistance and a low noise.

Yet another object of the present invention is to provide a compound field effect transistor of the type described above, which is easy and inexpensive to manufacture and highly reliable, and compact in size and light in weight. In order to attain this object, in the compound field effect transistor of the present invention, there are formed, on the surface of the semiconductor substrate, a first and a second epitaxially grown layer having a certain conductivity type same as that of said substrate. This first epitaxially grown layer is isolated electrically from the second epitaxial growth layer by mesa grooves. Also, the first epitaxially grown layer is isolated electrically from said semiconductor substrate by the pn-junction which terminates in said mesa grooves. Thus, the horizontal junction-type field effect transistor which utilizes a part of the first epitaxially grown layer as the conducting channel is formed as the input transistor. Also, the vertical junction-type field effect transistor which utilizes a part of the boundary between the second epitaxially grown layer and said semiconductor substrate as the conduction channel is formed as the output transistor. As stated above, the compound field effect transistor according to the present invention is constructed in the form of a monolithic integrated circuitry which is comprised of an input transistor having a high transconductance $gm$ and an output transistor having a high breakdown voltage by the combined use of the dielectric isolation technique utilizing mesa grooves and the pn-junction isolation technique.

DETAILED DESCRIPTION OF THE PREFERRED EMBODIMENTS

Figure 1:
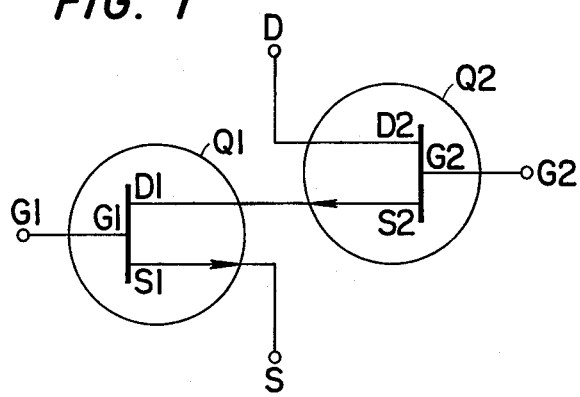
FIG. 1 is a circuit diagram of a compound field effect transistor according to the present invention.

Referring now to FIG. 1, reference symbols Q1 and Q2 represent an input transistor and an output transistor which, in combination, constitute a compound field effect transistor of a dual gate type. The gate electrode G1 of the input transistor Q1 is connected to the first gate terminal G1 of the compound field effect transistor. The source electrode S1 of the input transistor Q1 is connected to the source terminal S of the compound field effect transistor. The gate electrode G2 of the output transistor Q2 is connected to the second gate terminal G2 of the compound field effect transistor. The drain electrode D1 of the input transistor Q1 is connected to the source electrode S2 of the output transistor Q2. Also, the drain electrode D2 of the output transistor Q2 is connected to the drain terminal D of the compound field effect transistor.

Said compound field effect transistor may be constructed by the use of discrete input and output transistors Q1 and Q2, or the whole compound field effect transistor may be constructed into either a so-called hybrid integrated circuitry or a monolithic integrated circuitry as will be described later. Hereunder, however, description will be made on an instance wherein the transistor is constructed by discrete transistors.

Figure 4A:
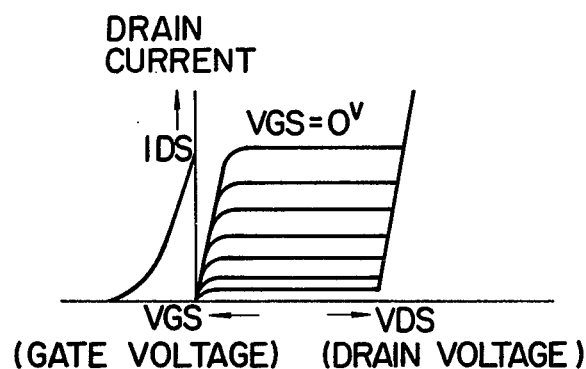
FIGS. 4a, 4b and 4c are charts of input and output characteristics of a horizontal junction-type field effect transistor $Q_1$ of FIGS. 1 and 2, the vertical junction-type field effect transistor $Q_2$ of FIGS. 1–3, and the compound field effect transistor shown in FIG. 2, respectively.

Said input transistor Q1 is a horizontal junction-type field effect transistor having a high transconductance $gm$. As shown in FIG. 4a, it has a saturated characteristic (drain current-drain voltage characteristic) resembling the output characteristic (plate current-plate voltage characteristic) of a pentode vacuum tube.

Figure 2:
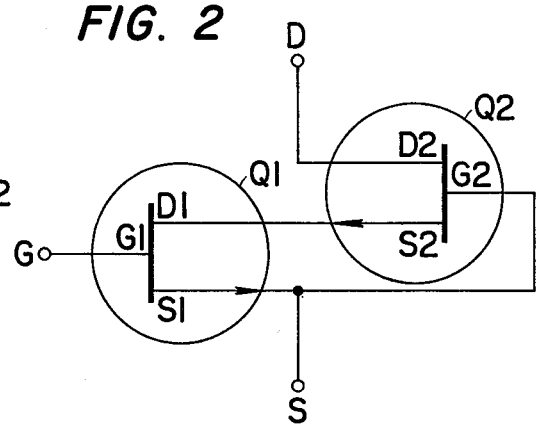
FIG. 2 is a circuit diagram of another embodiment of a compound field effect transistor according to the present invention.
Figure 3:
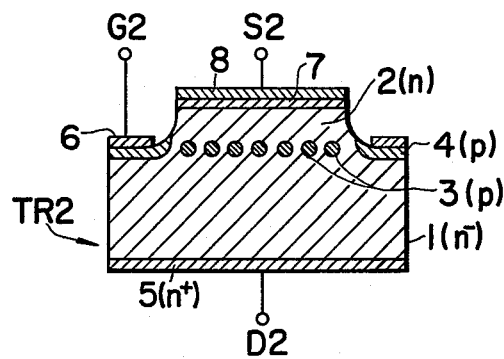
FIG. 3 is a vertical sectional view of one example of a vertical junction-type field effect transistor.
Figure 4B:
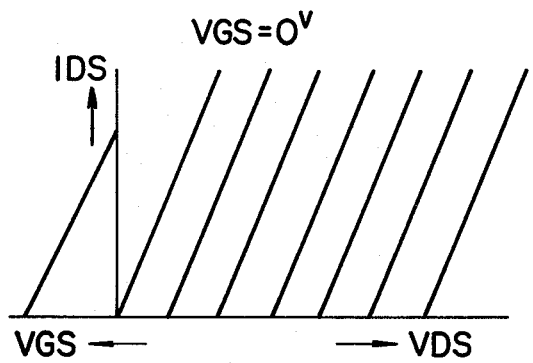

Said output transistor Q2 is a vertical junction-type field effect transistor. As shown in FIG. 4b, it exhibits an unsaturated characteristic (drain current-drain voltage characteristic) resembling the output characteristic of a triode vacuum tube. This transistor Q2 has a very low internal resistance and produces very low noises as compared with the horizontal junction-type field effect transistor. An example of this vertical junction-type field effect transistor is shown in FIG. 3. Reference numeral 1 represents a drain region which is composed of an n-type semiconductor layer. A source region 2 which is composed of an n-type epitaxially grown layer is provided on said drain region 1. A mesh-like gate region 3 of a p-type semiconductor is embedded at the boundary portion of these two regions 1 and 2. A metal gate electrode 6 is ohmicly brought into contact with a p-type region 4 of a low resistivity which is electrically connected to this gate region 3. Also, a source take-out layer 7 and a drain take-out layer 5 are in contact with the source region 2 and the drain region 1, respectively. A metal source electrode 8 is ohmicly brought into contact with the source take-out layer 7. The gate G2 of the second transistor Q2 may be internally connected to the source S1 of the first transistor Q1 rather than to the second gate terminal G2, and the gate G1 of the first transistor Q1 to the gate terminal to form a compound field effect transistor of a single gate type as shown in FIG. 2. This compound field effect transistor can of course be realized by the compound field effect transistor of FIG. 1, if the second gate terminal G2 and the source terminal S are connected together.

Figure 4C:
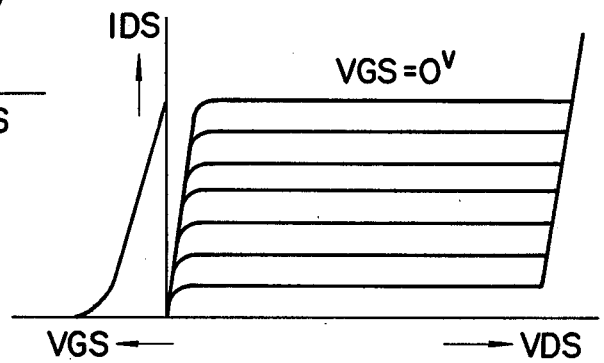

The output characteristic of this second (single gate, FIG. 2) embodiment of the compound field effect transistor of the present invention which is constructed as stated above is as shown in FIG. 4c.

Especially, the breakdown voltage and linearity of this transistor are improved greatly as compared with the known compound field effect transistor of this kind.

More specifically, a vertical junction-type field effect transistor which constitutes the output transistor Q2 has a very small internal resistance. Accordingly, the transconductange $gm$ of the compound field effect transistor is substantially equal to the transconductange $gm$ of the input transistor Q1, and will take a very large value. Also, because it is possible to manufacture a vertical junction-type field effect transistor having a much greater breakdown voltage, a much larger current capacity and being capable of producing very low noises as compared with the horizontal junction-type field effect transistor, the breakdown voltage of the compound field effect transistor of the present invention can be elevated easily to 500 V or higher, and moreover it is possible to attain an increase in the current capacity and a decrease in noise. Also, the transconductance $gm$, the linearity and the saturated characteristic of the compound field effect transistor of the present invention almost fully rely on the input transistor of this compound field effect transistor. With the exception of the breakdown voltage characteristic, these characteristics are hardly affected by the variance of the characteristics of the output transistor Q2. Therefore, the yield of manufacture of the compound field effect transistor of the present invention can be improved greatly.

Furthermore, the compound field effect transistor of the present invention is of the arrangement that the input transistor Q1 and the output transistor Q2 are connected together in the so-called cascode fashion. Accordingly, the Miller effect capacitance decreases greatly, resulting in that a superior high frequency characteristic is exhibited.

It will be apparent that in the compound field effect transistor of the present invention, instead of n-channel types p-channel horizontal and vertical junction-type field effect transistors can be used as the input transistor Q1 and the output transistor Q2, respectively.

Next, description will be made on an example of the compound field effect transistor which is constructed in the form of a monolithic integrated. circuitry. The equivalent circuit of this compound field effect transistor is as shown in FIG. 1.

In general, in case two or more field effect transistors are constructed into a monolithic integrated circuitry, these arises the problem on how the electrical isolation between the respective field effect transistors is accomplished. As the means for effecting this electrical isolation, the pn-junction isolation technique and the dielectric isolation technique are known.

The pn-junction isolation technique is not capable of elevating the isolation voltage very high, but this technique is convenient and easy from the manufacturing point of view. The dielectric isolation technique, on the other hand, is capable of elevating the isolation voltage sufficiently high, but is accompanied by a difficulty in the manufacture of a device.

As stated above, the compound field effect transistor of the present invention is a combination of the input transistor Q1 having a relatively low break-down voltage and the output transistor Q2 having a high breakdown voltage. Accordingly, in case it is intended to construct the compound field effect transistor of the present invention into a monolithic integrated circuitry, it is mandatory to adopt a construction which satisfies both the isolation voltage requirement and the advantage in the manufacturing technique.

In order to overcome such technical problems, the compound field effect transistor of the present invention is constructed in the manner as described below. That is to say, on the surface of a semiconductor substrate having a certain conductivity type are formed the first and the second epitaxially grown layers having the same conductivity type as that of the substrate. These two epitaxially grown layers are electrically isolated from each other by mesa grooves. Also, the first epitaxially grown layer is electrically isolated from the semiconductor substrate by the pn-junction which terminates in said mesa grooves. Thus, as the input transistor Q1, there is formed a horizontal junction-type field effect transistor using a part of the first epitaxially grown layer as its conducting channel. Along therewith, as an output transistor Q2, a vertical junction-type field effect transistor using a part of the boundary between said second epitaxially grown layer and said semiconductor substrate as its conducting channel is formed. Thus, the present invention aims at an increase in the density of integration and an easy manufacture of the device by an appropriate combined use of the dielectric isolation technique utilizing mesa grooves and the pn-junction isolation technique. More specifically, the dielectric isolation technique utilizing mesa grooves is adopted only for that part of the device wherein there develops a shortage of isolation voltage from the use of th pn-junction isolation technique. In the remaining portions of the device, there is employed the pn-junction isolation technique which makes the manufacture easy. Also, by arranging so that the pn-junction for isolation terminates in the mesa grooves, the present invention intends to increase an effective isolation voltage.

The manufacturing steps and the structure of the monolithic compound field transistor of the present invention will be described hereunder in further detail by referring to FIGS. 5a through 5g and FIG. 6.

Figure 5A:
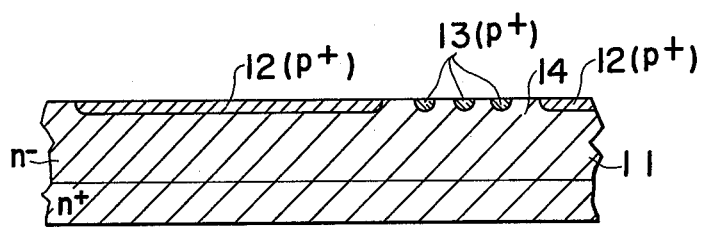
FIGS. 5a through 5g are vertical sectional views showing the manufacturing steps and the structure of the compound field effect transistor of the present invention which is constructed in the form of a monolithic integrated circuitry.

Firstly, as shown in FIG. 5a, on the upper surface of an n+-type backed n⁻-type semiconductor substrate 11 which is composed of, for example, silicon is formed a p+-type diffusion layer 12 having a relatively large area and having an aperture. Along with this, there is formed, on that surface 14 of the substrate 11 which is exposed through said aperture of the diffusion layer 12, a lattice-like p+-type diffusion layer 13 in such a way that its peripheral portions are in contact with said diffusion layer 12. These diffusion layers 12 and 13 can be formed simultaneously by relying on the diffusion technique.

Figure 5B:
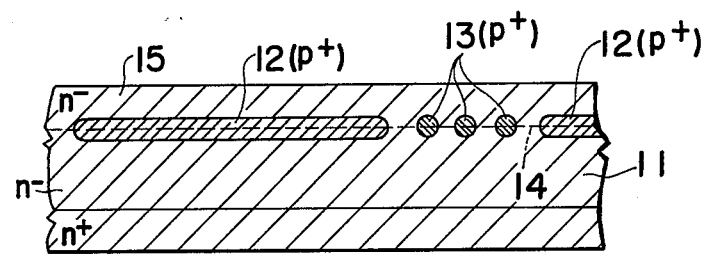

Next, as shown in FIG. 5b, by the known epitaxial growth technique, an n⁻-type epitaxially grown silicon layer 15, is formed so as to cover both the diffusion layers 12, 13 and the surface 14 of the substrate 11. During this part of process, the impurities contained in these diffusion layers 12 and 13 will more or less diffuse into the epitaxially grown layer 15. Accordingly, the diffusion layers 12 and 13 will bulge toward the epitaxially grown layer 15 side.

Figure 5C:
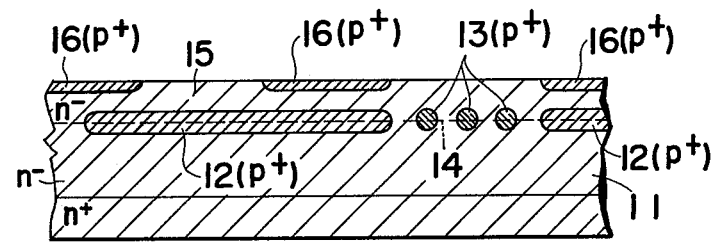

Then, as shown in FIG. 5c, a p+-type diffusion layer 16 is formed on the surface of the epitaxially grown layer 15 in a shape resembling a frame of eye glasses (i.e. having two apertures). This diffusion layer 16 is arranged so that its apertures are respectively positioned above a part of the diffusion layer 12 and also above the diffusion layer 13.

Figure 5D:
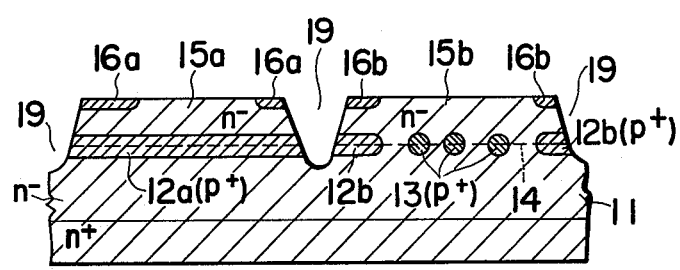

Thereafter, as shown in FIG. 5d, a mesa groove 19 for isolation purpose is formed by the known mask-etching technique. Because of this groove 19, the diffusion layer 12 is divided into the two portions, one of which is a portion 12a having a relatively large area and the other is a portion 12b surrounding the diffusion layer 13, and along with this the epitaxially grown layer 15 is divided into the two portions, one of which is a portion 15a which is adjacent to the portion 12a, and the other is portion 15b which is adjacent to the diffusion layer 13. Along with this process, the diffusion layer 16 is also divided into the following two portions, i.e. a portion 16a surrounding the surface of the portion 15a of the epitaxially grown layer and a portion 16b surrounding the surface of the portion 15b of ther epitaxially grown layer.

Figure 5E:
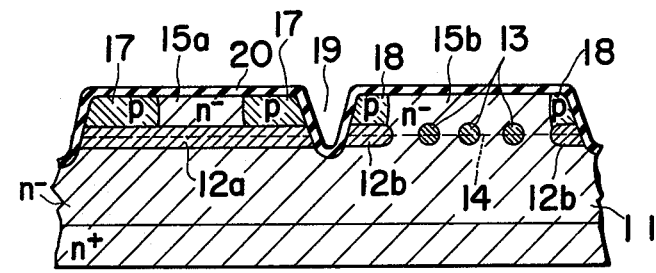

Furthermore, as shown in FIG. 5e, the p-type impurity in the diffusion layer portions 16a and 16b is caused to re-diffuse into the respective portions 15a and 15b of the epitaxially grown layer by the so-called drive-in diffusion technique, to thereby obtain rediffusion layers 17 and 18 which extend to reach the portions 12a and 12b of the diffusion layer, respectively. It is, however, desirable to utilize an oxidizing atmosphere in the aforesaid step to form an insulating film 20 such as a silicon oxide film to be ready for the subsequent step.

Figure 5F:
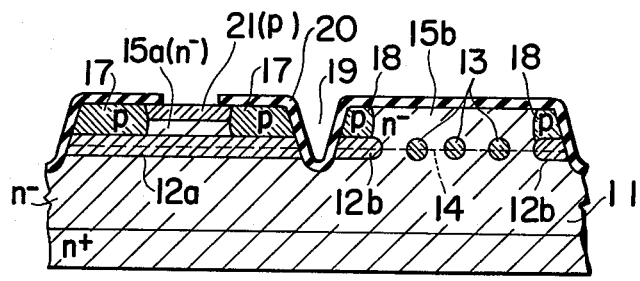
Figure 6:
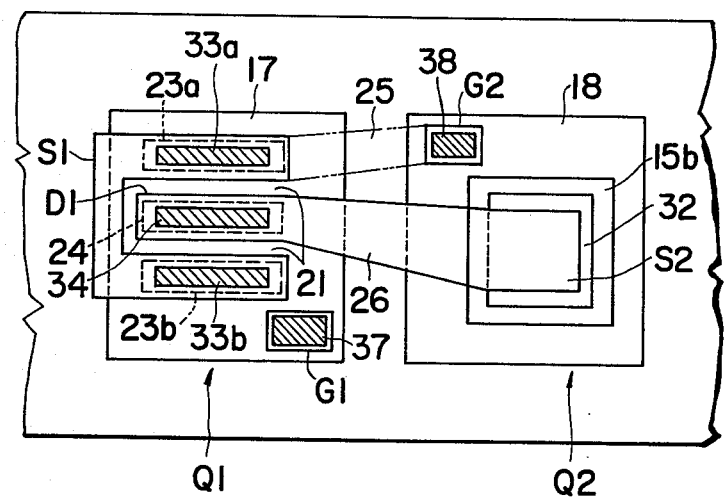
FIG. 6 is a plan view of the monolithic compound field effect transistor according to the present invention.

Thereafter, as shown in FIG. 5f, openings are formed by the photo-etching technique in a portion of this insulating film 20. A p-type impurity is selectively diffused through these openings to form a p-type diffusion layer 21 of a pattern as shown in FIG. 6 to constitute a gate in the portion 15a of the epitaxially grown layer. Thus, there are defined source regions 23a and 23b and a drain region 24 as openings in the gate. At the same time that said diffusion layer 21 is formed, highly concentrated regions 37 and 38 for contacting purpose may be formed on the surface of the diffusion layers 17 and 18, respectively as shown in FIG. 5f.

Figure 5G:
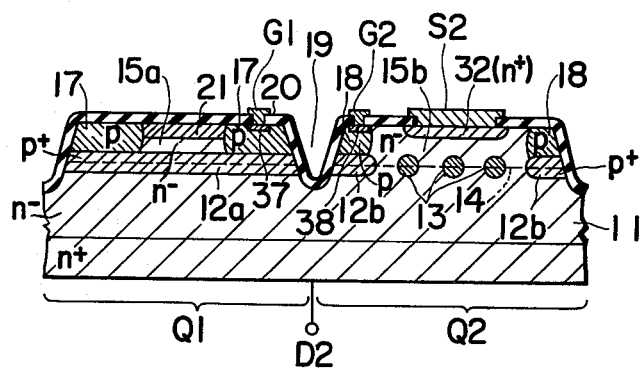

Then, as shown in FIG. 5g, an n+-type diffusion layer 32 for source take-out purpose is formed in the portion 15b of the epitaxially grown layer. Along with this, similar n+-type diffusion layers 33a, 33b and 34 for take-out purpose are formed also in said source regions 23a and 23b and in the drain region 24 as shown in FIG. 6 and not shown in FIG. 5g. The formation of these diffusion layers can be carried out at the same time by the use of the insulating film 20 as a mask and by selectively diffusing an n+-type impurity therethrough. Thus, there are formed an n-channel vertical junction-type field effect transistor constituting an output transistor Q2 which uses that portion 14 corresponding to the mesh of the lattice-like diffusion layer 13 as the conducting channel region, and an n-channel horizontal junction-type field effect transistor constituting an input transistor Q1 which uses a part of the epitaxially grown layer 15a as the conducting channel region.

Lastly, by the known electrode wiring technique which jointly uses the vacuum metal deposition technique and the photo-etching technique, gate electrodes G1 and G2, source electrodes S1 and S2, drain electrodes D1 and D2, and wiring strips are formed as shown in FIG. 6. The drain electrode D1 and the source electrode S2 are connected, by wiring layer 26, so as to form the circuitry shown in FIG. 1. In order to embody the compound field effect transistor of FIG. 2, a wiring strip 25 is provided as shown by two-dot chain lines in FIG. 6. With this, the monolithic compound field effect transistors of the present invention are completed.

The input transistor Q1 is electrically isolated from the output transistor Q2 by the air contained in the mesa groove 19 assigned for isolation and also by the insulating film 20 made of, for example, a silicon oxide film which is a dielectric. The insulating film 20 is not depicted in FIG. 6 for sake of simplicity. Along with this, the portion 15a of the epitaxially grown layer is electrically isolated from the semiconductor substrate 11 by the pn-junction which is formed between the portion 12a of the diffusion layer and the substrate 11. Thus, mutual electrical interference between these two transistors Q1 and Q2 is prevented. Since the pn-junction for isolation purpose terminates in the mesa groove 19 assigned for performing isolation, said pn-junction provides a required sufficient isolation voltage.

Also, the breakdown voltage of the output transistor Q2 of the monolithic compound field effect transistor according to the present invention is determined mainly by the impurity concentration and the thickness of the semiconductor substrate 11. In contrast thereto, the input transistor Q1 is isolated from the substrate 11 and accordingly the respective parameters of said input transistor Q1 can be determined independently of the output transistor Q2. As such, the monolithic compound field effect transistor enables one to obtain required characteristics by arbitrarily determining the respective parameters of both the input transistor Q1 and the output transistor Q2, and moreover this compound field effect transistor is free from manufacturing difficulty.

As stated, the monolithic compound field effect transistor is of the arrangement that two n-channel field effect transistors are combined together. It should be understood, however, that the compound field effect transistor of the present invention may be constructed by combining two p-channel field effect transistors. In case there is a frear for a breakage of wiring if the wiring layers 25 and 26 are formed so as to cross the mesa groove 19 which is assigned for isolation, the wiring across this mesa groove 19 may be performed by relying on the wire bonding technique. Also, the mesa groove 19 may be formed by the known oxidizing method or any other suitable method.

We claim:

1. A compound field effect transistor having an output characteristic resembling that of a pentode vacuum tube comprising:
    a first junction-type field effect transistor having a saturated drain current to drain voltage characteristic and having a first gate electrode for receiving an input signal, a first source electrode and a first drain electrode,
    means comprising a second junction-type field effect transistor having an unsaturating drain current to drain voltage characteristic for extending the drain-current-saturated operating drain voltage range of said compound transistor and for improving the equality of the intervals between the characteristic curves of said compound transistor,
    said second transistor having a second source electrode and a second drain electrode,
    said first drain electrode being connected to said second source electrode, and said first source and second drain electrodes being the output electrodes for exhibiting the said extended saturated output characteristic resembling a pentode tube.

2. A compound field effect transistor according to claim 1, in which:
    said second junction-type feld effect transistor is of a vertical type and is composed of:
    a second gate electrode
    a semiconductor substrate having a first conductivity type;
    a first semiconductor layer of the first conductivity type and formed on a part of the upper surface of said semiconductor substrate; and
    a lattice-like first gate layer having a second conductivity type opposite to said first conductivity type and beng provided at the boundary between said semiconductor substrate and said first semiconductor layer,
and in which:
    said second gate electrode, said second source electrode and said second drain electrode are electrically connected to said first gate layer, said first semiconductor layer and said semiconductor substrate, respectively,
and in which:
    said first junction-type field effect transistor is of a horizontal type and is comprised of a conducting channel having said first conductivity type.

3. A compound field effect transistor according to claim 2, in which:
    said first semiconductor layer is one formed by relying on the epitaxial growth method.

4. A compound field effect transistor according to claim 2, in which:
    said first conductivity type is one that has the free electrons as the majority carriers, and said second conductivity type is one that has the positive holes as the majority carriers.

5. A compound field effect transistor according to claim 2, in which:
    said first junction-type field effect transistor is composed of:
    a second semiconductor layer having said second conductivity type and assigned for isolation and being formed on that portion of the surface of said semiconductor substrate which is located at the site adjacent to the site where said first semiconductor layer is formed;
    a third semiconductor layer formed on the upper surface of said second semiconductor layer; and
    a second gate layer formed on the upper surface of said third semiconductor layer and being made with a semiconductor of said second conductivity type, and in which:
    said first gate electrode is connected electrically to said second gate layer,
and in which:
    said first source electrode and said first drain electrode are electrically connected, respectively, to said third semiconductor layer at positions at which these electrodes oppose each other across said second gate layer, and in which:
said first semiconductor layer is electrically isolated from said second semiconductor layer and from said third semiconductor by mesa grooves which terminate in said semiconductor substrate.

6. A compound field effect transistor according to claim 5, in which:
said first and said third semiconductor layers are those formed by relying on the epitaxial growth method,
and in which:
said first and said second gate layers and said second semiconductor layer are those formed by relying on the impurity diffusion method.

7. A compound field effect transistor having an output characteristic resembling that of a pentode vacuum tube, comprising:
a first junction-type field effect transistor having a saturated drain current to drain voltage characteristic and having a first gate electrode, a first source electrode and a first drain electrode,
means comprising a second junction-type field effect transistor having an unsaturating drain current to drain voltage characteristic for extending the drain-current-saturated operating drain voltage range of said compound transistor and for improving the equality of the intervals between the characteristic curves of said compound transistor,
said second transistor having a second gate electrode, a second source electrode and a second drain electrode,
a first terminal,
a second terminal, and
a third terminal,
said first terminal being connected to said first source electrode and to said second gate electrode,
said second terminal being connected to said second drain electrode,
said third terminal being connected to said first gate electrode for receiving an input signal
said first drain electrode being connected to said second source electrode, and
said first and second terminals being the output terminals for exhibiting the said extended saturated output characteristic resembling a pentode tube.

8. A compound transistor as in claim 7 wherein said second transistor is of the vertical type.

9. A compound transistor as in claim 8 wherein said first transistor is of the horizontal type.

10. A compound field effect transistor having an output characteristic resembling that of a pentode vacuum tube comprising:
a first junction-type field effect transistor having a saturated drain current to drain voltage characteristic and having a first gate electrode for receiving an input signal, a first source electrode and a first drain electrode,
means comprising a second junction-type field effect transistor having an unsaturating drain current to drain voltage characteristic for extending the drain-current-saturated operating drain voltage range of said compound transistor and for improving the equality of the intervals between the characteristic curves of said compound transistor,
said second transistor having a second source electrode and a second drain electrode,
said first drain electrode being connected to said second source electrode, and said first source and second drain electrodes being the output electrodes for exhibiting the said extended saturated output characteristic resembling a pentode tube,
wherein said second transistor is of the vertical type.

11. A compound transistor as in claim 10 wherein said first transistor is of the horizontal type.

12. A compound field effect transistor having an output characteristic resembling that of a pentode vacuum tube comprising:
a first junction-type field effect transistor having a saturated drain current to drain voltage characteristic and having a first gate electrode for receiving an input signal, a first source electrode and a first drain electrode,
means comprising a second junction-type field effect transistor having an unsaturating drain current to drain voltage characteristic for extending the drain-current-saturated operating drain voltage range of said compound transistor and for improving the equality of the intervals between the characteristic curves of said compound transistor,
said second transistor having a second gate electrode, a second source electrode and a second drain electrode,
said first drain electrode being connected to said second source electrode, and said first source and second drain electrodes being the output electrodes for exhibiting the said extended saturated output characteristic resembling a pentode tube, and
means for applying a second input signal to said second gate electrode to form a dual gate compound transistor.

13. A compound field effect transistor having an output characteristic generally resembling that of a pentode vacuum tube type, comprising:
a first junction-type field effect transistor having a first gate electrode for receiving an input signal, a first source electrode and a first drain electrode,
said first transistor being itself characterized by family of pentode vacuum tube type output characteristic curves for successive gate-source voltages of substantially equal increments,
each said curve having a saturated characteristic portion characterized by a drain-current-operating saturated drain voltage range extending to a respective maximum drain voltage for a given gate-source voltage before avalanche breakdown,
at least some of said family of curves having, in their said saturated portions at any given drain-source voltage, different drain-source current intervals for said successive gate-source voltages,
means for extending each of said saturated drain voltage ranges significantly beyond their said respective maximum drain voltage for their said given gate-source voltages respectively before avalanche breakdown and for significantly reducing the differences in the said intervals toward equalization between the saturated portions of all said curves,
said means comprising a second junction-type field effect transistor having its own family of output characteristics of the unsaturating triode vacuum tube type for cooperating with at least said saturated portions of said pentode type curves to effect both said significant drain voltage range extensions and said curve interval difference reductions,
said second transistor having a second source electrode and a second drain electrode, and said transistors being cascode connected with said first drain electrode being connected to said second source electrode, and said first source and second drain electrodes being the output electrodes for exhibiting the said extended and interval-difference reduced family of saturated output characteristic curves generally resembling those of a pentode tube.

14. A compound transistor as in claim 13, said second transistor further comprising a second gate electrode, and also including means for receiving a second input signal at said second gate electrode to form a dual gate compound transistor.

15. A compound field effect transistor having an output characteristic generally resembling that of a pentode vacuum tube type, comprising:
 a first junction-type field effect transistor having a first gate electrode for receiving an input signal, a first source electrode and a first drain electrode,
 said first transistor being itself characterized by a family of pentode vacuum tube type output characteristic curves for successive gate-source voltages of substantially equal increments,
 each said curve having a saturated characteristic portion characterized by a drain-current-operating saturated drain voltage range extending to a respective maximum drain voltage for a given gate-source voltage before avalanche breakdown,
 at least some of said family of curves having, in their said saturated portions at any given drain-source voltage, different drain-source current intervals, for said successive gate-source voltages,
 means for extending each of said saturated drain voltage ranges significantly beyond their said respective maximum drain voltage for their said given gate-source voltages respectively before avalanche breakdown and for significantly reducing the differences in the said intervals toward equalization between the saturated portions of all said curves,
 said means comprising a second junction-type field effect transistor having itw own family of output characteristics of the unsaturating triode vacuum tube type for cooperating with at least said saturated portions of said pentode type curves to effect both said significant drain voltage range extensions and said curve interval difference reductions,
 said second transistor having a second gate electrode, a second source electrode and a second drain electrode,
 a first terminal,
 a second terminal, and
 a third terminal,
 said transistors being cascode connected with first terminal being connected to said first source electrode and to said second gate electrode,
 said second terminal being connected to said second drain electrode,
 said third terminal being connected to said first gate electrode for receiving an input signal,
 said first drain electrode being connected to said second source electrode, and
 said first and second terminals being the output terminals for exhibiting the said extended and reduced interval difference family of saturated output characteristic curves generally resembling those of a pentode vacuum tube.

16. An improvement in the method of operating a compound field effect transistor of the type comprising first and second junction field effect transistors connected in cascode fashion with the first of said junction field effect transistors being itself characterized by a family of pentode vacuum tube type output characteristic curves for successive gate-source voltages of substantially equal increments with the saturated portions of said curves extending to respective avalanche breakdown voltages and with at least some of the intervals between successive ones of said saturated portions being different for any given drain-source voltage and the second of said junction field effect transistors having its own family of output characteristics of the unsaturating triode vacuum tube type, said improved method comprising the step of:
 operating said first and second junction field effect transistors simultaneously with said first junction field effect transistors operating on the saturated portion of one of its characteristic curves for significantly extending that saturated portion before reaching its new avalanche breakdown voltage and for significantly reducing the differences in said saturated portion intervals toward equalization therebetween for all said curves as to any given drain-source voltage common to the saturated portions thereof.

* * * * *